(12) United States Patent
Ahner et al.

(10) Patent No.: US 10,388,342 B2
(45) Date of Patent: Aug. 20, 2019

(54) 3D STORAGE CELLS

(71) Applicant: Seagate Technology LLC, Cupertino, CA (US)

(72) Inventors: Joachim Walter Ahner, Livermore, CA (US); David Marcus Tung, Livermore, CA (US)

(73) Assignee: Seagate Technology LLC, Cupertino, CA (US)

( * ) Notice: Subject to any disclaimer, the term of this patent is extended or adjusted under 35 U.S.C. 154(b) by 267 days.

(21) Appl. No.: 15/277,924

(22) Filed: Sep. 27, 2016

(65) Prior Publication Data

US 2018/0090164 A1    Mar. 29, 2018

(51) Int. Cl.
*G11C 11/00* (2006.01)
*G11C 13/04* (2006.01)

(52) U.S. Cl.
CPC ............ *G11C 11/00* (2013.01); *G11C 13/048* (2013.01)

(58) Field of Classification Search
None
See application file for complete search history.

(56) References Cited

U.S. PATENT DOCUMENTS

2011/0158062 A1*   6/2011   Watanabe .............. G11B 7/005
369/30.18

OTHER PUBLICATIONS

Jingyu Zhang*, Mindaugas Gecevicius, Martynas Beresna, Peter G. Kazansky; 5D Data Storage by Ultrafast Laser Nanostructuring in Glass, Optoelectronics Research Centre, University of Southampton, SO17 1BJ, United Kingdom, 2 pages.

* cited by examiner

*Primary Examiner* — Wayne Young
*Assistant Examiner* — Brian M Butcher

(57) ABSTRACT

Provided herein is an apparatus including a three dimensional crystalline structure including a number of storage locations. The storage locations are arranged in three dimensions within the crystalline structure. A light source is configured to focus a first light with a first energy on one of the storage locations in order to alter a characteristic of the storage location. The light source is further able to focus a second light with a second light energy on the storage location without altering the characteristic. A detector is provided to detect the second light energy.

19 Claims, 6 Drawing Sheets

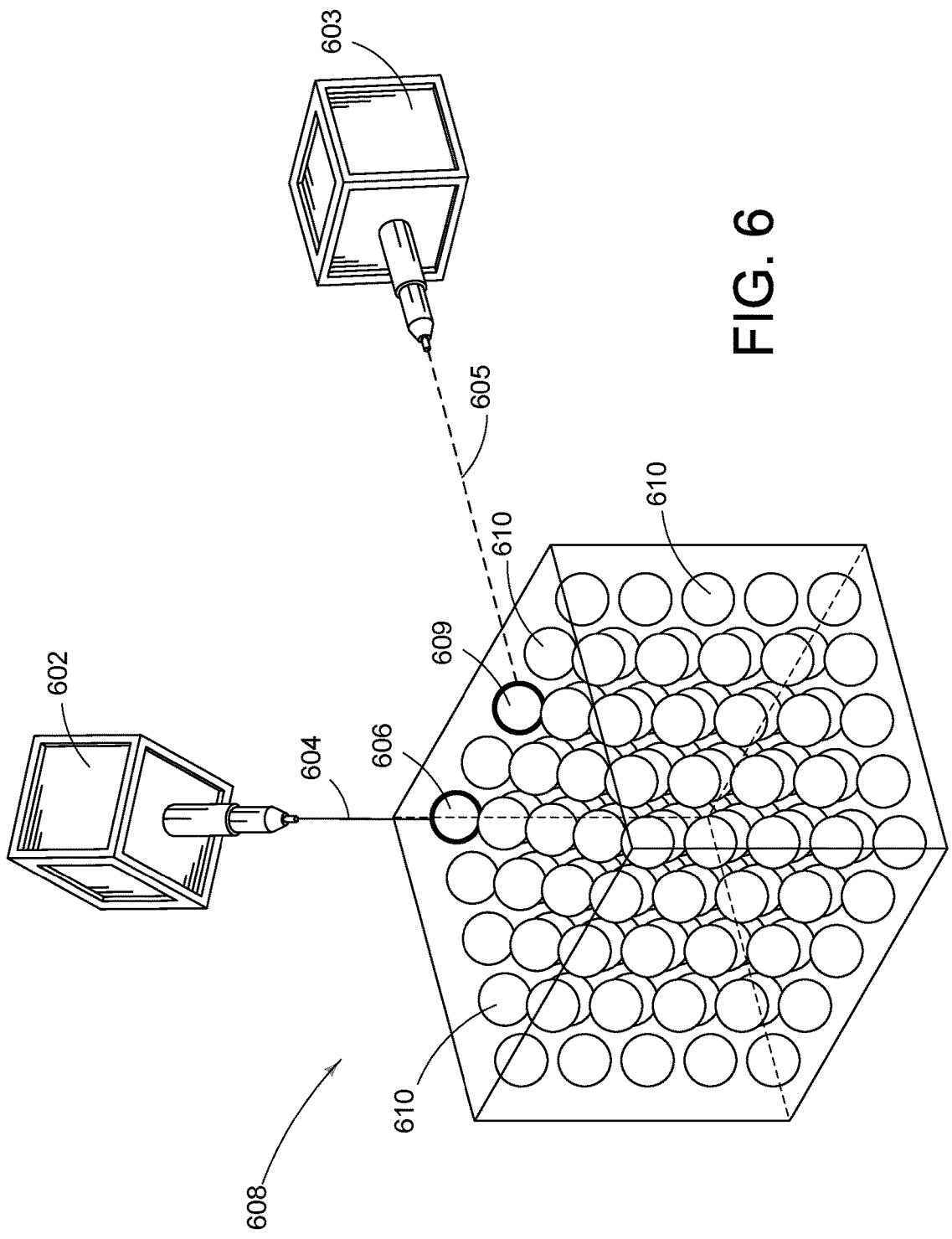

3D STORAGE CELLS

BACKGROUND

Certain devices use disk drives with perpendicular magnetic recording media to store information. For example, disk drives can be found in many desktop computers, laptop computers, and data centers. Perpendicular magnetic recording media store information magnetically as bits. Bits store information by holding and maintaining a magnetization that is adjusted by a disk drive head. In order to store more information on a disk, bits are made smaller and packed closer together, thereby increasing the density of the bits. Therefore as the bit density increases, disk drives can store more information. However as bits become smaller and are packed closer together, the bits become increasingly susceptible to erasure, for example due to thermally activated magnetization reversal or adjacent track interference.

SUMMARY

Provided herein is an apparatus including a three dimensional crystalline structure including a number of storage locations. The storage locations are arranged in three dimensions within the crystalline structure. A light source is configured to focus a first light with a first energy on one of the storage locations in order to alter a characteristic of the storage location. The light source is further able to focus a second light with a second light energy on the storage location without altering the characteristic. A detector is provided to detect the second light energy. These and other features and advantages will be apparent from a reading of the following detailed description.

BRIEF DESCRIPTION OF DRAWINGS

FIG. 6 shows a first emitter focusing a first laser on a first cell, and a second emitter focusing a second laser on a second cell of a three dimensional storage device according to one aspect of the present embodiments.

DESCRIPTION

Figure 1:
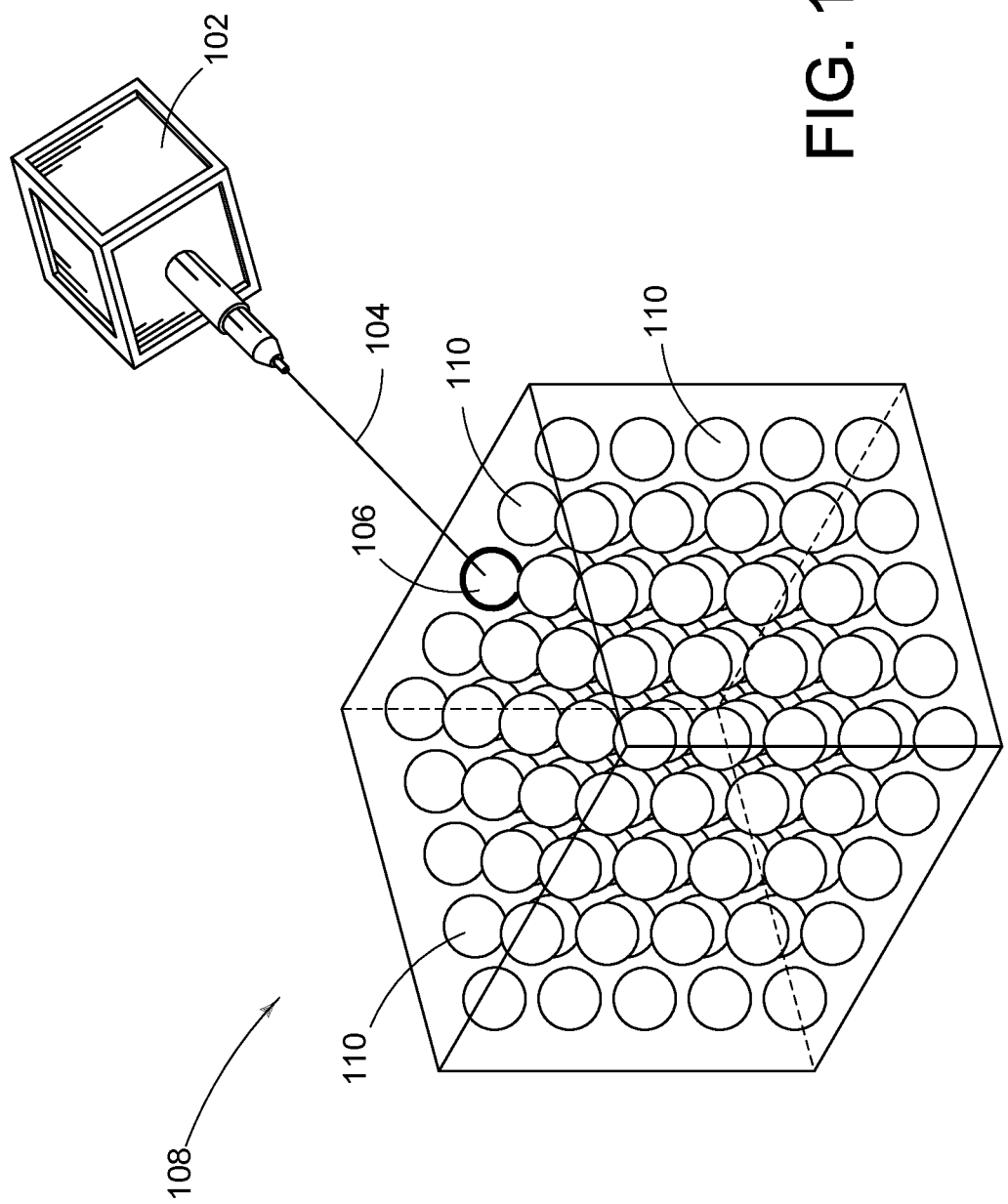
FIG. 1 shows an emitter focusing a laser on a target cell of a three dimensional storage device according to one aspect of the present embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

As the technology of magnetic recording media reaches maturity, it becomes increasingly difficult to continue to increase the storage capacity of recording media (e.g. disk drive disks) or to reduce the size of recording media while maintaining storage capacity. Such challenges may be overcome by increasing the bit density on the recording media. However, increasing the bit density is not always possible. For example, increasing bit density can decrease the signal to noise ratio ("SNR") below acceptable levels. Furthermore, reducing the bit size or the thickness of the stack lowers the thermal stability of the grains within the bits, thereby increasing the grains' susceptibility to fluctuation and information loss.

Embodiments described below address these concerns with information storage cells arranged in a three dimensional structure where information is stored electrically with the use of one or more lasers. For example, in various embodiments a higher power write laser is used to write information to a storage cell by electrically changing the properties of the storage cell. A lower power read laser is used to read the stored information from the storage cell, without altering the properties (e.g. changing the stored information) of the storage cell. The read/write lasers may be focused at any depth and location within the three dimensional structure, without being interfered with or interfering with other storage cells.

Referring now to FIG. 1, an emitter 102 focusing a laser 104 on a target cell 106 of a three dimensional storage device 108 is shown according to one aspect of the present embodiments. The emitter 102 may be for example a femtosecond laser that emits light energy as the laser 104. The laser 104 is focused on the target cell 106. The target cell 106 is one of many storage cells 110 arranged within a three dimensional array within the three dimensional storage device 108. When the laser 104 is focused on the target cell 106, properties of the target cell 106 are altered, thereby storing information. For example, the laser 104 may change properties of the target cell 106 including reflectivity, transparency, and/or refractivity. In addition, properties of the target cell 106 affecting polarization, wavelength, phase, intensity, frequency, and/or coherence may also be selectively adjusted by the laser 104. It is understood that these properties are not limiting and other properties of the target cell 106 may also be selectively changed. Therefore, as a result of altering the properties, information may be written to the cells.

The emitter 102 is configured to alter the properties of the target cell 106 by focusing the laser 104 directly on the target cell 106. As such, the laser 104 does not affect other storage cells 110 until the laser 104 is focused on another storage cell. The laser 104 may be focused at any location and depth within the three dimensional storage device 108. For example, the emitter 102 may focus the laser 104 at a location directly in the middle of the three dimensional storage device 108. As a result, the laser 104 will pass through many of the storage cells 110, without affecting their characteristics. However, the storage cell directly in the middle that the laser 104 is focused upon will have its characteristics changed as a result of the focused laser 104. In various embodiments, the storage cells 110 retain their characteristics after the writing process performed by the emitter 102 and the laser 104.

It is understood that in various embodiments the illustrated storage cells 110 are figurative representations of locations within the three dimensional storage device 108. Therefore, in some embodiments two similarly shaped and sized three dimensional storage devices may have different densities and/or patterns of storage cells as a result of varying the focused locations of the laser 104.

The three dimensional storage device 108 is a transparent or semi-transparent material. For example, the three dimensional storage device 108 may include quartz, diamond, aluminum oxide, or other transparent/semi-transparent materials. In various embodiments, the laser 104 may create little to no heat within the three dimensional storage device 108. It is understood that heat may be prevented, for example, by selecting an emitter 102 which produces a laser 104 that does not cause the molecules of the three dimensional storage device 108 to vibrate in a heat producing fashion. For example, a femtosecond laser may be focused on the target cell 106, without heating the target cell 106, other storage cells 110, and other areas of the three dimensional storage device 108. Such examples for preventing or limiting heat are merely exemplary and are understood to be non-limiting.

Figure 2:
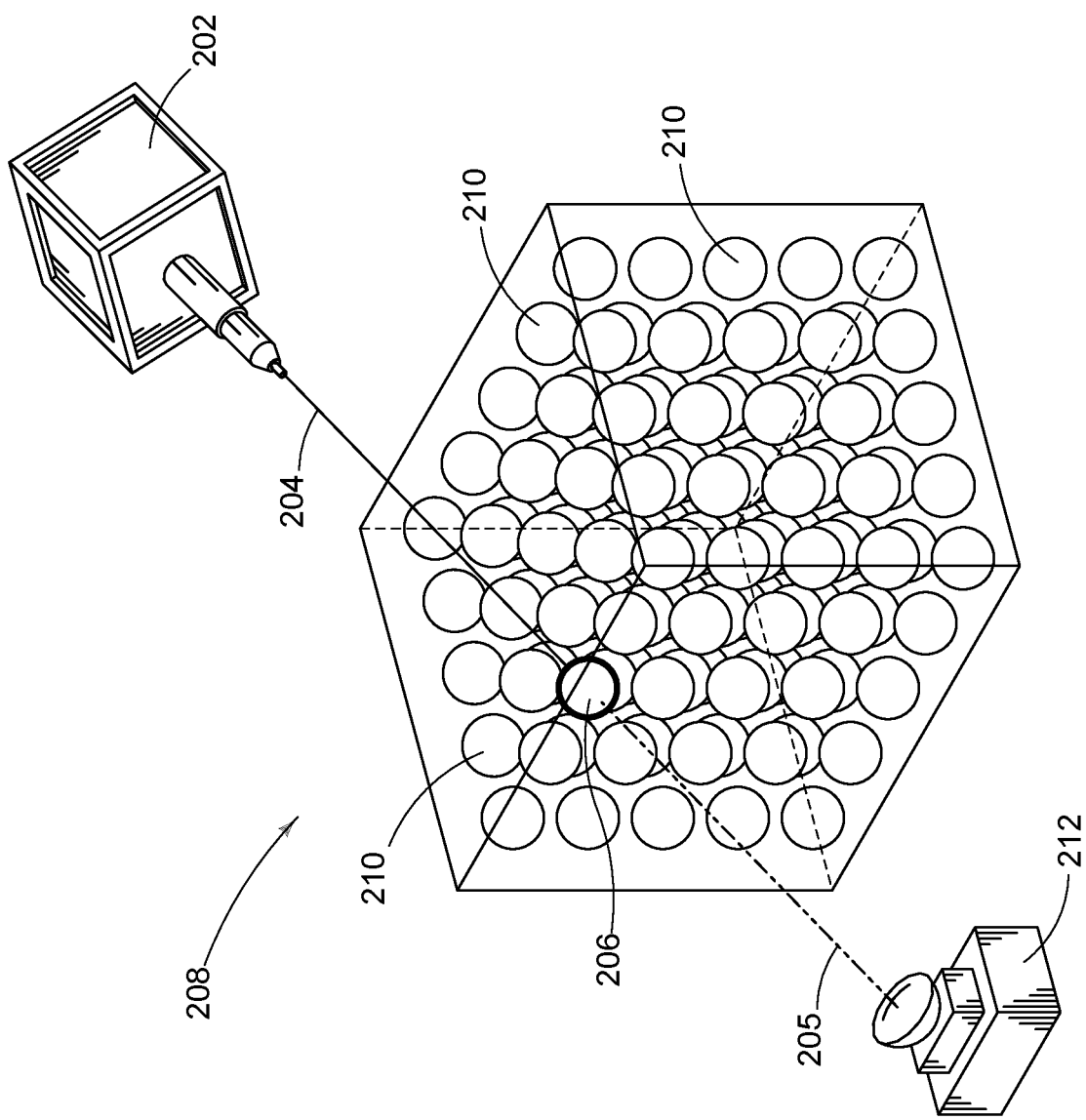
FIG. 2 shows a cell of a three dimensional storage device altering a laser from an emitter, and a detector detecting the altered laser according to one aspect of the present embodiments.

Referring now to FIG. 2, a target cell 206 of a three dimensional storage device 208 altering a laser 204 from an emitter 202, and a detector 212 detecting the altered laser 205 is shown according to one aspect of the present embodiments. The emitter 202 generates a lower power laser 204 than the FIG. 1 laser 104. As such, the lower power laser 204 may be focused on the target cell 206, without altering the properties of the target cell 206. However, the properties of the target cell 206 may alter the laser 204, thereby transforming the laser 204 into the altered laser 205. The altered laser 205 is then detected at the detector 212. As a result, information stored by the target cell 206 may be read through the detection of the altered laser 205. It is understood that in certain configurations the target cell 206 may not alter the properties of the laser 204, and therefore the altered laser 205 may be the same as the laser 204.

For example, information may be stored in one or more of the cells, as described in FIG. 1. The emitter 202 may then generate the laser 204 with a first property (for example a first wavelength). The laser 204 is focused on the target cell 206, and travels through other storage cells 210, without being altered. The target cell 206 then changes the first property of the laser 204 into a second property (for example a second wavelength) thereby transforming the laser 204 into an altered laser 205. The altered laser 205 is then received at the detector 212, which interprets the altered laser 205 as the information stored earlier in the target cell 206. In various embodiments, one or more of the other storage cells 210 may also alter the laser 204, thereby contributing to the alterations of the altered laser 205 that is detected at the detector 212.

In some embodiments, the information detected at the detector 212 may be binary, as a result of bistable states of the target cell 206. For example, the detector 212 may determine whether the altered laser 205 is the same as (state 1) or different from (state 2) the laser 204. Such a determination would allow for binary information to be stored and read. In some embodiments, the information detected at the detector 212 may be more complicated, as a result of many different possible states of the target cell 206. For example, the detector 212 may determine whether the altered laser 205 has a first wavelength, second wavelength, third wavelength, fourth wavelength, etc. Such a determination would allow for information beyond binary states to be stored and read.

It is understood that FIG. 1 and FIG. 2 work in conjunction with each other, and that for clarity of illustration certain elements of FIG. 1 and FIG. 2 are not pictured in both figures (e.g. the detector 212). In various embodiments, the emitter 102 and the emitter 202 may be the same emitter or different emitters. For example, a single emitter may be used to emit the higher power laser used in the write functions described with respect to FIG. 1. The same single emitter may also be used to emit the lower power laser used in the read functions described with respect to FIG. 2. In further embodiments, the emitter 102 used to write information may be separate from the emitter 202 used to read information.

FIGS. 1 and 2 illustrate, for example, an exemplary non-limiting embodiment including a first storage cell (e.g. the target cell 106, 206). A second storage cell is disposed over the first storage cell in a vertical plane of the first storage cell (e.g. cells above the target cell 106, 206). A third storage cell is disposed adjacent to the first storage cell in a horizontal plane of the first storage cell (e.g. cells next to the target cell 106, 206). The first storage cell, the second storage cell, and the third storage cell are configured to change their respective cell characteristics in response to a first light energy (e.g. the laser 104 changes the properties of the storage cells 106). In addition, the first storage cell, the second storage cell, and the third storage cell are configured to maintain the change to their respective cell characteristics (e.g. the storage cells 106 that are changed by the laser 104 retain the change). In response to a second light energy (e.g. the laser 204), the respective cell characteristics are configured to change a property of the second light energy (e.g. change the laser 204 into the altered laser 205), wherein the first light energy (e.g. the laser 104) is greater than the second light energy (e.g. the laser 204).

In various embodiments, the respective cell characteristics are configured to remain the same in response to the second light energy (e.g. the laser 204). Some embodiments include a first light energy source (e.g. the laser 104) that is configured to change the first storage cell, the second storage cell, and the third storage cell one at a time (e.g. the laser 104 changes the properties of the storage cells 106 one at a time).

Further embodiments include a light energy source that is configured to emit the first light energy and the second light energy (e.g. a single emitter generates both the high power laser 104 and the low power laser 204), and further configured to change the respective cell characteristics in response to the first light energy without heating the first storage cell, the second storage cell, and the third storage cell (e.g. the laser 104 does not heat the three dimensional storage device 108).

In various embodiments, a detector (e.g. the detector 212) is configured to detect the second light energy passing through the first storage cell, the second storage cell, or the third storage cell. In some embodiments, the detector is configured to detect the second light energy reflected from the first storage cell, the second storage cell, or the third storage cell (see FIG. 3 below for a description of detecting reflected light). In further embodiments, the first storage cell, the second storage cell, and the third storage cell are configured to remain transparent while maintaining the change to their respective cell characteristics (e.g. characteristics of the storage cells 110, 210 of the three dimensional storage device 108, 208 are changed while maintaining transparency of the three dimensional storage device 108, 208).

Figure 3:
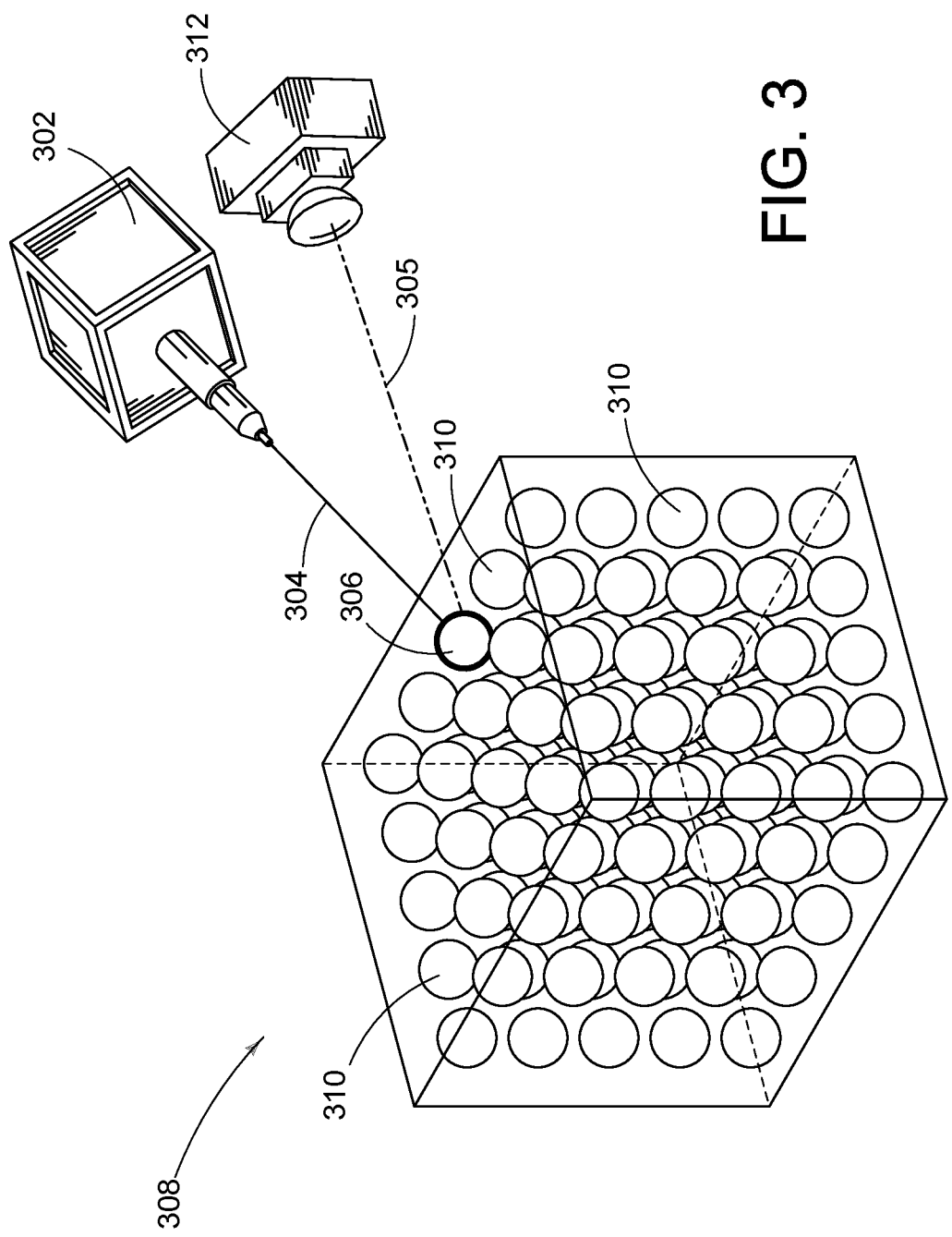
FIG. 3 shows a cell of a three dimensional storage device reflecting and altering a laser from an emitter, and a detector detecting the altered laser according to one aspect of the present embodiments.

Referring now to FIG. 3, a target cell 306 of a three dimensional storage device 308 reflecting and altering a laser 304 from an emitter 302, and a detector 312 detecting the altered laser 305 is shown according to one aspect of the present embodiments. Similar to FIG. 2, in the embodiment of FIG. 3 the emitter 302 generates a lower power laser 304 than the FIG. 1 laser 104. As such, the lower power laser 304 may be focused on a target cell 306, without altering the properties of the target cell 306.

However, the properties of the target cell 306 may alter and reflect the laser 304 (or a portion of the laser 304), thereby transforming the laser 304 into the altered laser 305. Therefore, the target cell 306 of FIG. 3 differs from the target cell 206 of FIG. 2 by reflecting the laser 305. As a result, the altered laser 305 is a reflected laser that is then detected at the detector 312. Information stored by the target cell 306 may be read through the detection of the altered laser 305. It is understood that in certain configurations the target cell 306 may not alter the properties of the laser 304, and therefore the altered laser 305 may be the same as the laser 304.

For example, information may be stored in one or more of the cells, as described in FIG. 1. The emitter 302 may then generate a laser 304 with a first property (for example a first intensity). The laser 304 is focused on the target cell 306, and travels through other storage cells 310, without being altered. The target cell 306 then changes the first property of the laser 304 into a second property (for example a second intensity) thereby transforming the laser 304 into an altered laser 305. The altered laser 305 is then reflected from the target cell 306 and received at the detector 312. The detector 312 interprets the altered laser 305 as the information stored earlier in the target cell 306. In various embodiments, one or more of the other storage cells 310 may also alter the laser 304, thereby contributing to the alterations of the altered laser 305 that is detected at the detector 312.

In some embodiments, the information detected at the detector 312 may be binary, as a result of bistable states of the target cell 306. For example, the detector 312 may determine whether the altered laser 305 is the same as (state 1) or different from (state 2) the laser 304. Such a determination would allow for binary information to be stored and read. In some embodiments, the information detected at the detector 312 may be more complicated, as a result of many different possible states of the target cell 306. For example, the detector 312 may determine whether the altered laser 305 has a first intensity, second intensity, third intensity, fourth intensity, etc. Such a determination would allow for information beyond binary states to be stored and read.

It is understood that FIG. 1 and FIG. 3 work in conjunction with each other, and that for clarity of illustration certain elements of FIG. 1 and FIG. 3 are not pictured in both figures (e.g. the detector 312). In various embodiments, the emitter 102 and the emitter 302 may be the same emitter or different emitters. For example, a single emitter may be used to emit the higher power laser used in the write functions described with respect to FIG. 1. The same single emitter may also be used to emit the lower power laser used in the read functions described with respect to FIG. 3. In further embodiments, the emitter 102 used to write information may be separate from the emitter 302 used to read information.

Figure 4:
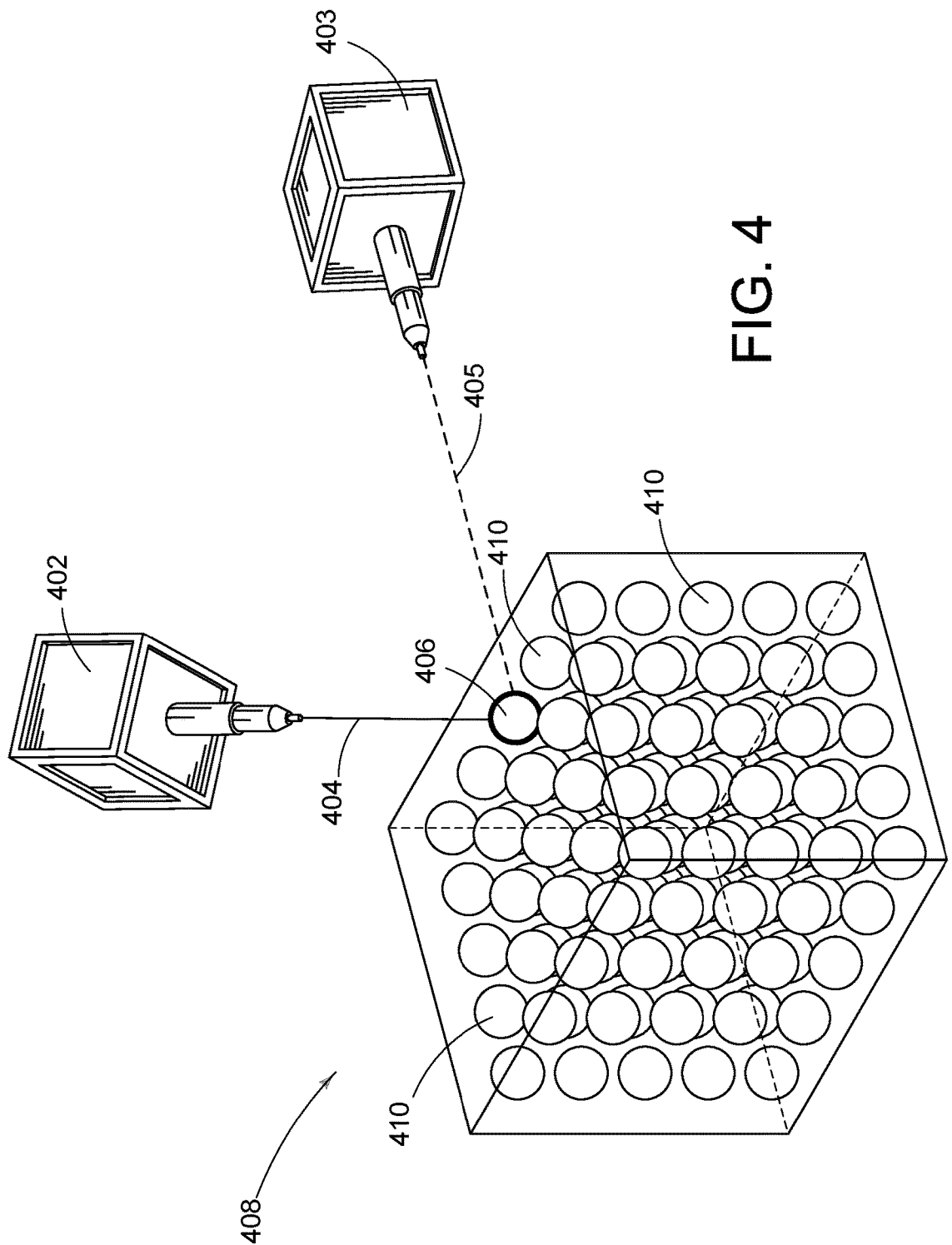
FIG. 4 shows a first emitter and a second emitter focusing a first laser and a second laser on a cell of a three dimensional storage device according to one aspect of the present embodiments.

Referring now to FIG. 4, a first emitter 402 and a second emitter 403 focusing a first laser 404 and a second laser 405 on a cell 406 of a three dimensional storage device 408 are shown according to one aspect of the present embodiments. As in FIG. 1, the first emitter 402 creates a high power first laser 404, and the second emitter 403 creates a low power second laser 405. It is understood that high power and low power are relative to each other. Therefore, the first laser 404 has a higher power than the second laser 405, and the second laser 405 has a lower power than the first laser 404.

The first laser 404 is focused on the target cell 406. The target cell 406 is one of many storage cells 410 arranged within a three dimensional array within the three dimensional storage device 408. When the laser 404 is focused on the target cell 406, properties of the target cell 406 may be altered (as previously described), thereby storing information.

In addition, the second emitter 403 may be focused on the target cell 406. In various embodiments, the second emitter 403 may create a lower power second laser 405 or a higher power second laser 405. Therefore, the second emitter 403 may be used in conjunction with the first emitter 402 for writing information to the target cell 406. In addition, the second emitter 403 may be used to read information from the target cell 406 before, during, and/or after the first emitter creates the first laser 404. For clarity of illustration, the detector (see FIG. 3) is not shown, however it is understood that one or more detectors may be present in various embodiments.

In further embodiments, different intensities of the first laser 404 (from the first emitter 402) and the second laser 405 (from the second emitter 403) may be combined for reading and/or writing to the target cell 406. For example, the first laser 404 alone and the second laser 405 alone may not have sufficient power to write to the target cell 406. However, the combination of the first laser 404 and the second laser 405 may have sufficient power to write to the target cell 406. Therefore, it is understood that various combinations of laser intensities may be used to read cell properties or change cell properties.

Figure 5:
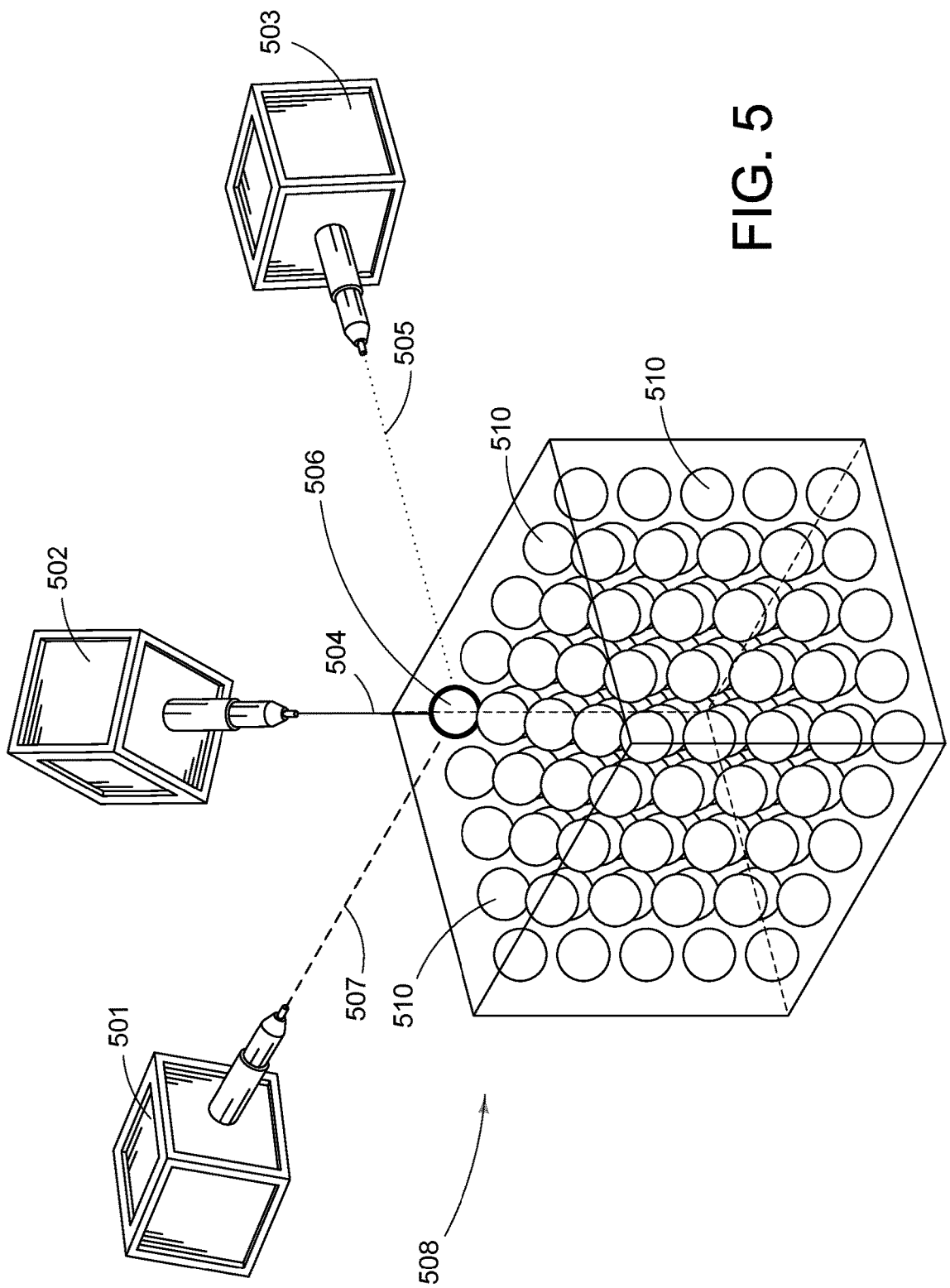
FIG. 5 shows a first emitter, a second emitter, and a third emitter focusing a first laser, a second laser, and a third laser on a cell of a three dimensional storage device according to one aspect of the present embodiments.

Referring now to FIG. 5, a first emitter 502, a second emitter 503, and a third emitter 501 focusing a first laser 504, a second laser 505, and a third laser 507 on a cell 506 of a three dimensional storage device 508 are shown according to one aspect of the present embodiments. As in FIG. 1, the first emitter 502 creates a higher power first laser 504. The first laser 504 is focused on the target cell 506. The target cell 506 is one of many storage cells 510 arranged within a three dimensional array within the three dimensional storage device 508. When the laser 504 is focused on the target cell 506, properties of the target cell 506 may be altered (as previously described), thereby storing information.

In addition, the second emitter 503 and the third emitter 501 may be focused on the target cell 506. In various embodiments, the second emitter 503 creates a lower power second laser 505 or a higher power second laser 505, and the third emitter 501 creates a lower power third laser 507 or a higher power third laser 507. It is understood that any combination of differently powered lasers may be used. For example, a high power laser, a medium power laser, and a low power laser may be used by any of the three emitters. In a further example, a high power laser and two low power lasers may be used by any of the three emitters. In still further examples, different power combinations may be produced by any of the emitters.

Therefore for example, the second emitter 503 and/or the third emitter 501 may be used in conjunction with the first emitter 502 for writing information to the target cell 506. In addition, the second emitter 503 and/or the third emitter 501 may be used to read information from the target cell 506 before, during, and/or after the first emitter creates the first laser 504. For clarity of illustration, the detector (see FIG. 3) is not shown, however it is understood that one or more detectors may be present in various embodiments.

In further embodiments, different intensities of the first laser 504 from the first emitter 502, the second laser 505 from the second emitter 503, and/or the third laser 507 from the third emitter 501 may be combined for reading and/or writing to the target cell 506. For example, the first laser 504 alone, the second laser 505 alone, and/or the third laser 507 alone may not have sufficient power to write to the target cell 506. However, the combination of the first laser 504, the second laser 505, and/or the third laser 507 may have sufficient power to write to the target cell 506. In a still further example, different lasers or combinations of lasers may change and/or read different properties (e.g. reflectivity, transparency, refractivity, etc.) of the cell. The different properties may be changed or read simultaneously or at different times. Therefore, it is understood that various combinations of laser intensities may be used to read cell properties or change cell properties.

Referring now to FIG. 6, a first emitter 602 focusing a first laser 604 on a first cell 606, and a second emitter 603 focusing a second laser 605 on a second cell 609 of a three dimensional storage device 608 are shown according to one aspect of the present embodiments. As in previous figures, the first emitter 602 may perform read/write operations on the first target cell 606 by radiating a higher power or lower power first laser 604. The first laser 604 is focused on the first target cell 606. The first target cell 606 is one of many storage cells 610 arranged within a three dimensional array within the three dimensional storage device 608. When the laser 604 is focused on the target cell 606, properties of the target cell 606 may be altered or read (as previously described). It is understood that the first emitter 602 may perform the read/write functions by itself or in conjunction with one or more additional emitters.

In addition, the second emitter 603 may be focused on the second target cell 609. The second emitter 603 may perform read/write operations on the second target cell 609 by radiating a higher power or lower power second laser 605. The second laser 605 is focused on the second target cell 609. The second target cell 609 is one of many storage cells 610 arranged within the three dimensional array within the three dimensional storage device 608. When the second laser 605 is focused on the second target cell 609, properties of the second target cell 609 may be altered or read (as previously described). It is understood that the second emitter 603 may perform the read/write functions by itself or in conjunction with one or more additional emitters.

In various embodiments, the first emitter 602 and the second emitter 603 may perform read functions or write functions at the same time or at different times. In some embodiments, different read functions and different writing functions may be performed simultaneously by the first emitter 602 and the second emitter 603. For example, the first emitter 602 may be detecting or changing the transparency of the first target cell 606, and the second emitter 603 may be detecting or changing the reflectivity of the second target cell 609. For clarity of illustration, one or more detectors (see FIG. 3) are not shown, however it is understood that one or more detectors may be present in numerous combinations with the emitters in various embodiments.

Therefore, as described above, embodiments may include a three dimensional crystalline structure with a number of storage locations, wherein the storage locations are arranged in three dimensions within the crystalline structure. A light source is configured to focus a first light with a first energy on a storage location of the number of storage locations. The focused first light is operable to alter a characteristic of the storage location. The light source is further operable to focus a second light with a second light energy on the storage location without altering the characteristic. A detector is operable to detect the second light energy.

In some embodiments the light source is a femtosecond laser. In various embodiments, the characteristic changes polarization, wavelength, phase, intensity, frequency, or coherence of the second light energy. In further embodiments, the light source is operable to alter the characteristic without heating the three dimensional crystalline structure.

In some embodiments, the detector is operable to detect the second light energy passing through the storage location. In various embodiments, he detector is operable to detect the second light energy reflected from the storage location. In further embodiments, the storage location is operable to remain transparent while maintaining the characteristic or the alteration to the characteristic.

Furthermore, as described above, embodiments may include a first location configured to change a first characteristic in response to a first energy. In addition, a second location may be over the first location in a z-axis, and configured to change a second characteristic in response to the first energy. A third location may be adjacent to the first location in an x-axis, and configured to change a third characteristic in response to the first energy. A detector may be configured to detect a second energy focused on the first location, the second location, or the third location, wherein the first location, the second location, and the third location are configured to remain unchanged in response to the second energy.

In various embodiments, an energy source may be configured to individually focus the first energy on the first location, the second location, or the third location. In some embodiments, the energy source is configured to emit the first energy and the second energy, and the energy source is configured to change the first characteristic, the second characteristic, or the third characteristic without heating the first location, the second location, or the third location. In further embodiments, the detector is configured to detect the second energy passing through the first location, the second location, or the third location.

In various embodiments, the detector is configured to detect the second energy reflected from the first location, the second location, or the third location. In some embodiments, the first location, the second location, and the third location are configured to remain transparent while maintaining the change to their respective characteristics.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. An apparatus comprising:
   a first storage cell;
   a second storage cell disposed over the first storage cell in a vertical plane of the first storage cell; and
   a third storage cell disposed adjacent to the first storage cell in a horizontal plane of the first storage cell, wherein
      the first storage cell, the second storage cell, and the third storage cell are configured to change their respective cell characteristics in response to a first light energy, without heating the first storage cell, the second storage cell, or the third storage cell,
      the first storage cell, the second storage cell, and the third storage cell are configured to maintain the change to their respective cell characteristics,
      in response to a second light energy, the respective cell characteristics are configured to change a property of the second light energy, and
      the first light energy is greater than the second light energy.

2. The apparatus of claim 1, wherein the respective cell characteristics are configured to remain the same in response to the second light energy.

3. The apparatus of claim 1, further comprising a first light energy source, wherein the first light energy source is configured to change the first storage cell, the second storage cell, and the third storage cell one at a time.

4. The apparatus of claim 1, further comprising a light energy source, wherein
   the light energy source is configured to emit the first light energy and the second light energy, and
   the light energy source is configured to change the respective cell characteristics in response to the first light energy without heating the first storage cell, the second storage cell, and the third storage cell.

5. The apparatus of claim 1, further comprising a detector configured to detect the second light energy passing through the first storage cell, the second storage cell, or the third storage cell.

6. The apparatus of claim 1, further comprising a detector configured to detect the second light energy reflected from the first storage cell, the second storage cell, or the third storage cell.

7. The apparatus of claim 1, wherein the first storage cell, the second storage cell, and the third storage cell are configured to remain transparent while maintaining the change to their respective cell characteristics.

8. An apparatus comprising:
   a three dimensional crystalline structure including a plurality of storage locations, wherein the plurality of storage locations is arranged in three dimensions within the crystalline structure;
   a light source configured to focus a first light with a first energy on a storage location of the plurality of storage locations, wherein
      the focused first light is operable to alter a characteristic of the storage location,
      the light source is further operable to focus a second light with a second light energy on the storage location without altering the characteristic, and
      the light source is operable to alter the characteristic without heating the three dimensional crystalline structure; and
   a detector operable to detect the second light energy.

9. The apparatus of claim 8, wherein the light source is a femtosecond laser.

10. The apparatus of claim 8, wherein the characteristic changes polarization, wavelength, phase, intensity, frequency, or coherence of the second light energy.

11. The apparatus of claim 8, wherein the detector is operable to detect the second light energy passing through the storage location.

12. The apparatus of claim 8, wherein the detector is operable to detect the second light energy reflected from the storage location.

13. The apparatus of claim 8, wherein the storage location is operable to remain transparent while maintaining the characteristic or the alteration to the characteristic.

14. An apparatus comprising:
   a first location configured to change a first characteristic in response to a first energy, without heating the first location;
   a second location over the first location in a z-axis configured to change a second characteristic in response to the first energy; and
   a third location adjacent to the first location in an x-axis configured to change a third characteristic in response to the first energy; and
   a detector configured to detect a second energy from the first location, the second location, or the third location, wherein the first location, the second location, and the third location are configured to remain unchanged in response to the second energy.

15. The apparatus of claim 14, further comprising an energy source configured to individually focus the first energy on the first location, the second location, or the third location.

16. The apparatus of claim 14, further comprising an energy source, wherein
   the energy source is configured to emit the first energy and the second energy, and
   the energy source is configured to change the first characteristic, the second characteristic, or the third characteristic without heating the first location, the second location, or the third location.

17. The apparatus of claim 14, wherein the detector is configured to detect the second energy passing through the first location, the second location, or the third location.

18. The apparatus of claim 14, wherein the detector is configured to detect the second energy reflected from the first location, the second location, or the third location.

19. The apparatus of claim 14, wherein the first location, the second location, and the third location are configured to remain transparent while maintaining the change to their respective characteristics.

* * * * *